(12) United States Patent  
Ahn et al.

(10) Patent No.: US 8,446,197 B2  
(45) Date of Patent: *May 21, 2013

(54) DELAY LOCKED LOOP AND METHOD FOR DRIVING THE SAME

(75) Inventors: Seung-Joon Ahn, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 194 days.

This patent is subject to a terminal disclaimer.

(21) Appl. No.: 12/755,949

(22) Filed: Apr. 7, 2010

(65) Prior Publication Data

US 2011/0156767 A1 Jun. 30, 2011

(30) Foreign Application Priority Data

Dec. 29, 2009 (KR) .................. 10-2009-0133433

(51) Int. Cl.  
*H03L 7/00* (2006.01)

(52) U.S. Cl.  
USPC .......................................................... 327/161

(58) Field of Classification Search  
None  
See application file for complete search history.

(56) References Cited

U.S. PATENT DOCUMENTS 6,731,146 B1 * 5/2004 Gallardo ................. 327/158  
7,459,949 B2 * 12/2008 Mai ......................... 327/158  
7,876,137 B2 * 1/2011 Heightley ............... 327/158

FOREIGN PATENT DOCUMENTS

| JP | 2001283589 | 10/2001 |
| KR | 100792379 | 1/2008 |
| KR | 1020080003023 | 1/2008 |
| KR | 1020090024918 | 3/2009 |

OTHER PUBLICATIONS

Notice of Allowance issued from Korean Intellectual Property Office on Apr. 20, 2011.

* cited by examiner

*Primary Examiner* — Daniel Rojas  
(74) *Attorney, Agent, or Firm* — IP & T Group LLP

(57) ABSTRACT

A delay locked loop includes a delay pulse generation unit, a coding unit, and a delay line. The delay pulse generation unit is configured to generate a delay pulse having a certain width. The coding unit is configured to code the delay pulse and output a code value. The delay line is configured to delay an input clock by the code value, and generate a delayed locked clock. The delay pulse has a logic high level state during a third period equivalent to a difference between a first period, which corresponds to an integer multiple of the input clock, and a second period, which is a certain replica delay period.

21 Claims, 4 Drawing Sheets

DELAY LOCKED LOOP AND METHOD FOR DRIVING THE SAME

CROSS-REFERENCE TO RELATED APPLICATIONS

The present application claims priority of Korean Patent Application No. 10-2009-0133433, filed on Dec. 29, 2009, which is incorporated herein by reference in its entirety.

BACKGROUND OF THE INVENTION

Exemplary embodiments of the present invention relate to an integrated circuit, and more particularly, to a delay locked loop of a semiconductor memory device and a driving method thereof.

Semiconductor memory devices, such as a dynamic random access memory (DRAM), have continuously improved in their integration density and operating speed. In order to increase the operating speed, synchronous memory devices designed to operate in synchronization with clocks provided from the outside of memory chips (i.e., external clocks) have been developed. Such synchronous memory devices may use a delay locked loop (DLL) to generate an internal clock by delaying an external clock for a predetermined time so that data are outputted exactly in synchronization with rising and falling edges of the external clock.

A DLL generates an internal clock in which a delay element inside a memory device is compensated for synchronization with an external clock. This process performed by the DLL is called delay locking. A delay locked state refers to a state in which a reference clock (REFCLK) and a feedback clock (FBCLK) are synchronized with each other. A typical DLL achieves the synchronization between a feedback clock (FBCLK) and a reference clock (REFCLK) by adjusting a delay amount.

FIG. 1 is a block diagram of a typical DLL.

Referring to FIG. 1, the DLL includes a buffering unit 100, a phase comparison unit 110, a delay control unit 120, a variable delay unit 130, and a delay model unit 140.

The buffering unit 100 is configured to buffer an external clock EXTCLK and transfer the buffered external clock to the DLL as a reference clock REFCLK. The phase comparison unit 110 is configured to compare a phase of the reference clock REFCLK with a phase of a feedback clock FBCLK, and the delay control unit 120 is configured to generate a delay control signal CTR in response to an output signal of the phase comparison unit 110. The variable delay unit 130 is configured to delay the reference clock REFCLK in response to the delay control signal CTR. The delay model unit 140 is configured to reflect a delay of an actual clock/data path of an output signal of the variable delay unit 130 and output the feedback signal FBCLK.

The feedback clock FBCLK is a clock in which the reference clock REFCLK is adjusted by a delay time of the variable control unit 130 and a delay time of the delay model unit 140. The DLL compares the reference clock REFCLK with the feedback clock FBCLK and outputs a desired DLL clock DLLCLK when the two clocks have minimum jitters That is, the DLL outputs a DLL clock DLLCLK when delay locking is achieved.

Such a DLL having a conventional closed loop structure must undergo a feedback operation several times until delay locking is achieved. Consequently, a lot of time may be taken to achieve delay locking, and thus, a large amount of current may be consumed.

SUMMARY OF THE INVENTION

Exemplary embodiments of the present invention are directed to a DLL which is capable of reducing a delay locking time and current consumption of a delay locking circuit.

In accordance with an embodiment of the present invention, a delay locked loop includes a delay pulse generation unit configured to generate a delay pulse having a pulse width corresponding to a delay amount for delay locking a clock signal, a coding unit configured to output a code value according to the delay pulse, and a delay line configured to delay the clock signal according to the code value.

In accordance with another embodiment of the present invention, a delay locked loop includes a replica delay oscillation unit configured to generate a replica oscillation signal having a period corresponding to a replica delay, a division unit configured to divide the replica oscillation signal and a clock signal, a pulse generation unit configured to generate a delay pulse having a pulse width corresponding to a delay amount for delay locking the clock signal according to output signals of the division unit, a coding unit configured to output a code value according to the delay pulse, and a delay line configured to delay the clock signal according to the code value.

In accordance with yet another embodiment of the present invention, a delay locked loop includes a delay pulse generation unit configured to generate a delay pulse having a certain width, a coding unit configured to code the delay pulse and output a code value, and a delay line configured to delay an input clock by the code value, and generate a delayed locked clock, wherein the delay pulse has a logic high level state during a third period equivalent to a difference between a first period, which corresponds to an integer multiple of the input clock, and a second period, which is a certain replica delay period.

In accordance with still another embodiment of the present invention, a method for driving a delay locked loop includes generating a delay pulse having a certain pulse width, coding the delay pulse to output a code value, and delaying an input clock by the code value to generate a delayed locked clock, wherein the delay pulse has a logic high level state during a third period equivalent to a difference between a first period, which corresponds to an integer multiple of the input clock, and a second period, which is a certain replica delay period.

DESCRIPTION OF SPECIFIC EMBODIMENTS

Figure 1:
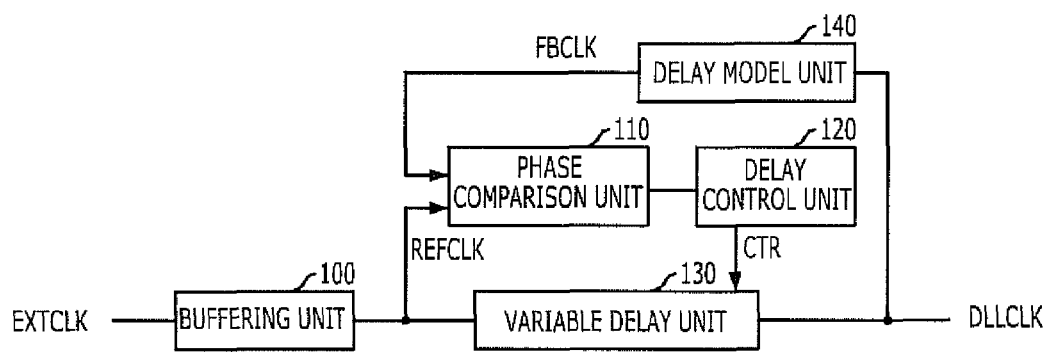
FIG. 1 is a block diagram of a typical DLL having a closed loop structure.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
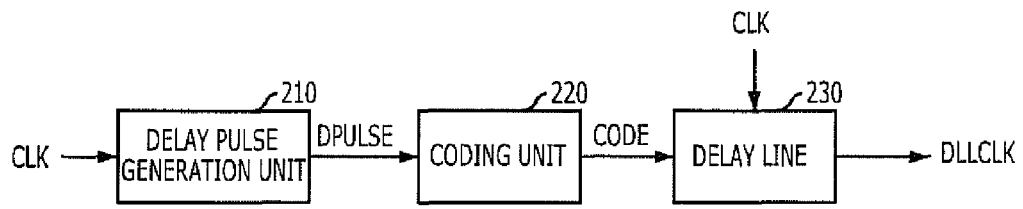
FIG. 2 is a block diagram of a DLL in accordance with an embodiment of the present invention.

FIG. 2 is a block diagram of a DLL in accordance with an embodiment of the present invention.

Referring to FIG. 2, the DLL includes a delay pulse generation unit 210, a coding unit 220, and a delay line 230. The delay pulse generation unit 210 is configured to generate a delay pulse DPULSE having a pulse width corresponding to a delay amount necessary for delay locking a clock signal CLK. The coding unit 220 is configured to receive the delay pulse DPULSE and convert the delay amount, necessary for delay locking, into a code value CODE. The delay line 230 is configured to delay the clock signal CLK according to the code value CODE, and output a delay locked clock (i.e., a DLL clock DLLCLK).

Figure 3:
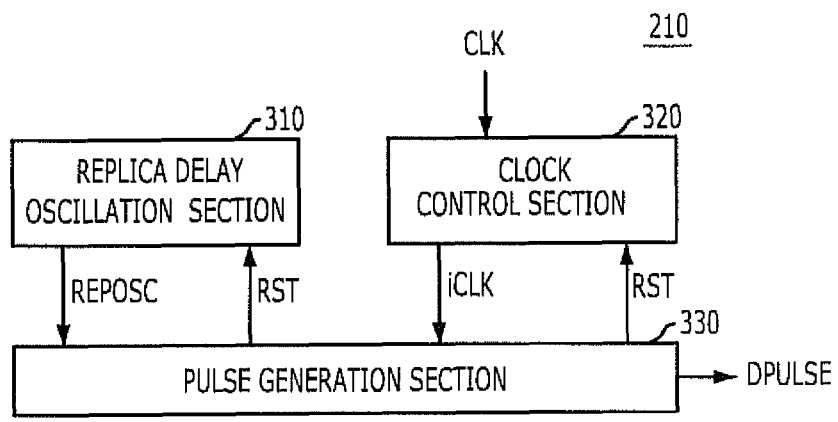
FIG. 3 is a block diagram illustrating an exemplary configuration of a delay pulse generation unit shown in FIG. 2.

FIG. 3 is a block diagram illustrating an exemplary configuration of the delay pulse generation unit 210 shown in FIG. 2.

The delay pulse generation unit 210 includes a replica delay oscillation section 310, a clock control section 320, and a pulse generation section 330.

The operation of the delay pulse generation unit 210 in accordance with the exemplary configuration is described below with reference to FIG. 3.

The replica delay oscillation section 310 generates a replica oscillation signal REPOSC having a period corresponding to a replica delay (a delay which occurs in a clock signal output path), and outputs the replica oscillation signal REPOSC in response to a reset signal RST.

The clock control section 320 receives the clock signal CLK and outputs the received clock signal iCLK in response to the reset signal RST.

The pulse generation section 330 receives the replica oscillation signal REPOSC and the clock signal iCLK and generates the delay pulse DPULSE having a pulse width corresponding to the delay amount necessary for performing delay locking. In addition, the pulse generation section 330 generates the reset signal RST, which resets the DLL. The operation of the pulse generation section 330 is described in more detail with reference to FIGS. 4 and 5, which are a block diagram and a partial circuit diagram of the pulse generation section 330, respectively.

Figure 4:
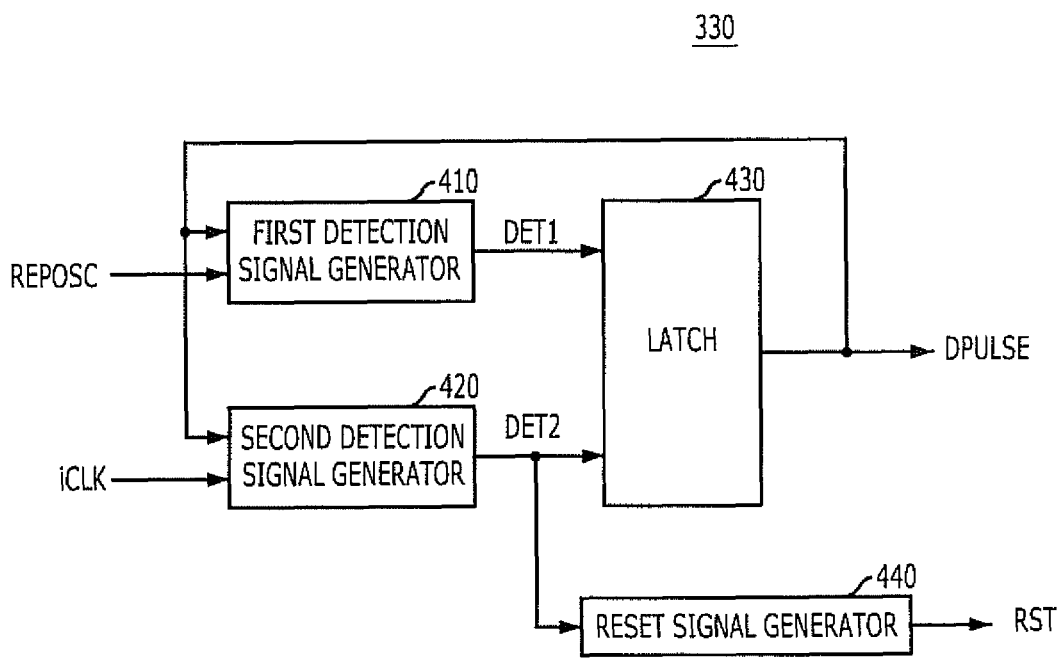
FIG. 4 is a block diagram illustrating an exemplary configuration of a pulse generation section shown in FIG. 3.
Figure 6:
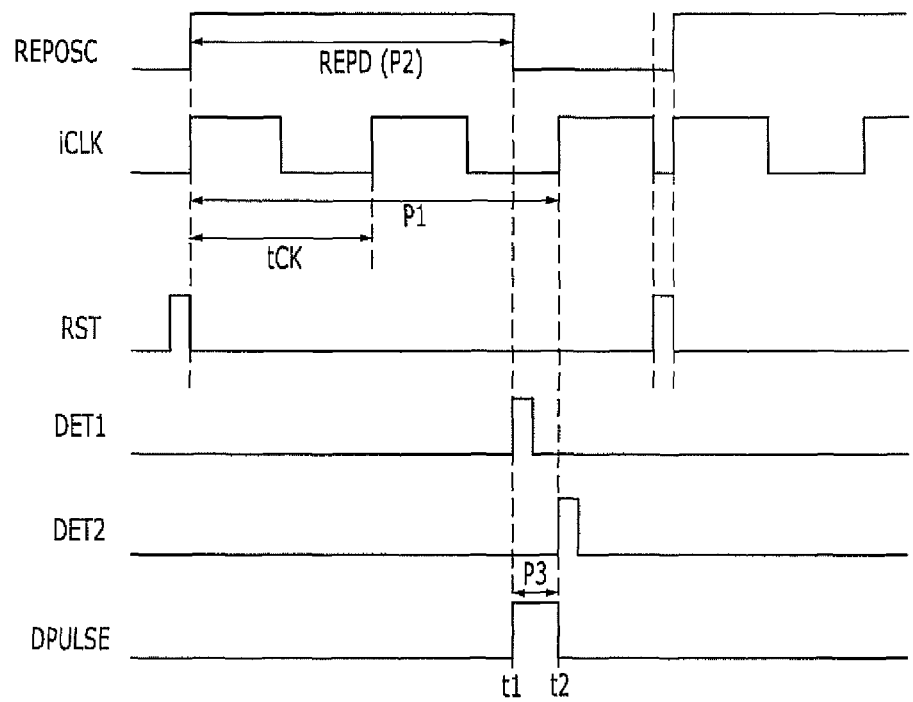
FIG. 6 is a timing diagram illustrating an operation of the pulse generation section shown in FIG. 4.

FIG. 4 is a block diagram illustrating an exemplary configuration of the pulse generation section 330 shown in FIG. 3, and FIG. 6 is a timing diagram illustrating an operation of the exemplary configuration of the pulse generation section 330.

Referring to FIG. 4, the pulse generation section 330 includes a first detection signal generator 410, a second detection signal generator 420, a latch 430, and a reset signal generator 440.

The operation of the pulse generation section 330 will be described below with reference to FIGS. 4 and 6.

The DLL begins to operate when the reset signal RST is applied. A long pulse duration of the replica oscillation signal REPOSC results in a delay amount REPD, which is provided by a replica. In this case, the delay amount necessary for performing delay locking is equal to the product of 'n' (where n is an integer greater than zero) times the period tck of the clock signal iCLK minus the delay amount REPD. In other words, the delay amount necessary for performing delay locking is equal to n*tCK−REPD.

The first detection signal generator 410 generates a first detection signal DET1 which is activated in synchronization with a falling edge of the replica oscillation signal REPOSC, and the second detection signal generator 420 generates a second detection signal DET2 which is activated in synchronization with a rising edge of the clock signal iCLK after the generation of the first detection signal DET1.

The latch 430 receives the first detection signal DET1 and the second detection signal DET2 and generates the delay pulse DPULSE which is activated at an activation timing of the first detection signal DET1 and deactivated at an activation timing of the second detection signal DET2. The latch 430 may be implemented with an RS flip-flop. In this case, the delay pulse DPULSE may be generated by inputting the first detection signal DET1 and the second detection signal DET2 as SET and RESET inputs, respectively.

The delay pulse DPULSE is in a logic high state during a third period P3 defined as the period of time beginning at the end of a second period P2, which is a predefined replica delay period REPD, and ending at the end of a first period P1, which corresponds to an integer multiple of the clock signal iCLK.

The reset signal generator 440 receives and delays the second detection signal DET2 by a certain time, and outputs the reset signal RST. The delay amount used to delay the second detection signal DET2 in the reset signal generator 440 must be equal to or greater than the time taken until the delay line 230 delays the clock signal CLK according to the code value CODE after the generation of the second detection signal DET2.

Figure 5:
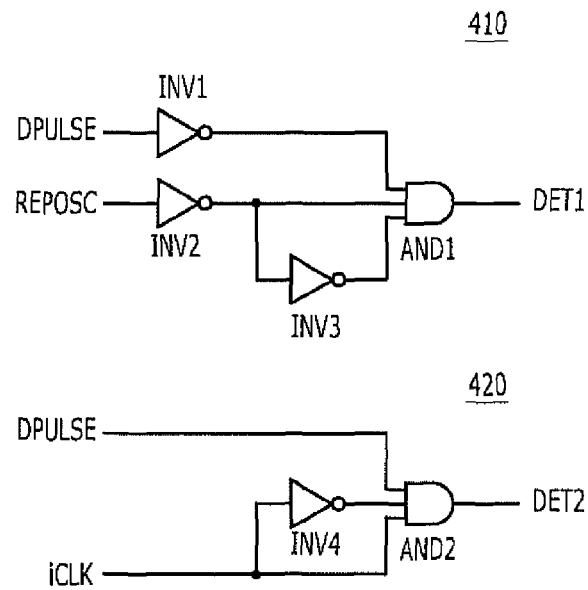
FIG. 5 is a circuit diagram illustrating exemplary configurations of detection signal generators shown in FIG. 4.

FIG. 5 is a circuit diagram illustrating exemplary configurations of the first detection signal generator 410 and the second detection signal generator 420 shown in FIG. 4.

The first detection signal generator 410 includes a first inverter INV1 configured to invert the delay pulse DPULSE, a second inverter INV2 configured to invert the replica oscillation signal REPOSC, a third inverter INV3 configured to invert an output signal of the second inverter INV2, and a first AND gate AND1 configured to perform an AND operation on output signals of the first to third inverters INV1, INV2, and INV3, and output the first detection signal DET1.

The second detection signal generator 420 includes a fourth inverter INV4 configured to invert the clock signal iCLK, and a second AND gate AND2 configured to perform an AND operation on the delay pulse DPULSE, the clock signal iCLK, and an output signal of the fourth inverter INV4, and output the second detection signal DET2.

The operations of the first detection signal generator 410 and the second detection signal generator 420 are described below with reference to FIGS. 5 and 6.

First, an operation of the first detection signal generator 410 is described.

When the replica oscillation signal REPOSC changes to a logic high level due to the reset signal RST, a logic low level signal is applied to the first AND gate AND1 by the second inverter INV2, and the first detection signal DET1 having a logic low level is outputted. Until time t1, when the replica oscillation signal REPOSC changes from a logic high level to a logic low level, the delay pulse DPULSE maintains a logic low level because it is activated after the first detection signal DET1 changes to a logic high level. Then at time t1, a logic high level signal is applied to the first AND gate AND1 by both of the first and second inverters INV1 and INV2. The third inverter INV3 also applies a logic high signal to the first AND gate AND1 for its delay time from time t1, when the replica oscillation signal REPOSC changes from a logic high level to a logic low level. Therefore, the first detection signal DET1 has a logic high level because logic high level signals are applied to all input terminals of the first AND gate AND1 for a period of time equivalent to the delay time of the third inverter INV3, after the time t1 at which the replica oscillation signal REPOSC changes from a logic high level to a logic low level. After the elapse of the delay time caused by the third inverter INV3, the first detection signal DET1 has a logic low level because a second input terminal of the first AND gate AND1 (to which the output signal of the second inverter INV2 is inputted) and a third input terminal of the first AND gate AND1 (to which the output signal of the third inverter INV3 is inputted) have different logic levels.

Next, the operation of the second detection signal generator 420 is described.

After the generation of the reset signal RST, the delay pulse DPULSE maintains a logic low level until the first detection signal DET1 is activated. Thus, the second AND gate AND2 receiving the delay pulse DPULSE outputs the second detection signal DET2 having a logic low level. After the first detection signal DET1 is activated, the second detection signal DET2 further maintains a logic low level until the clock signal iCLK changes from a logic low level to a logic high level, i.e., during a period t3. When the clock signal iCLK changes from a logic low level to a logic high level (e.g., at time t2), the second detection signal DET2 is activated and maintains a logic high level for a period of time equivalent to a delay time of the fourth inverter INV4, before changing to a logic low level.

Figure 7:
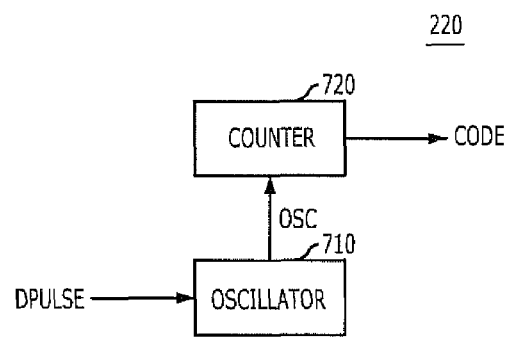
FIG. 7 is a block diagram illustrating an exemplary configuration of a coding unit shown in FIG. 2.

FIG. 7 is a block diagram illustrating an exemplary configuration of the coding unit 220 shown in FIG. 2.

The coding unit 220 includes an oscillator 710 and a counter 720. The oscillator 710 generates an oscillation signal OSC having a period corresponding to an integer multiple of a unit delay amount of the delay line 230. The counter 720 counts the number of cycles of the oscillation signal OSC which are included within the pulse width of the delay pulse DPULSE, codes the counted number of cycles, and outputs the code value CODE.

Figure 8:
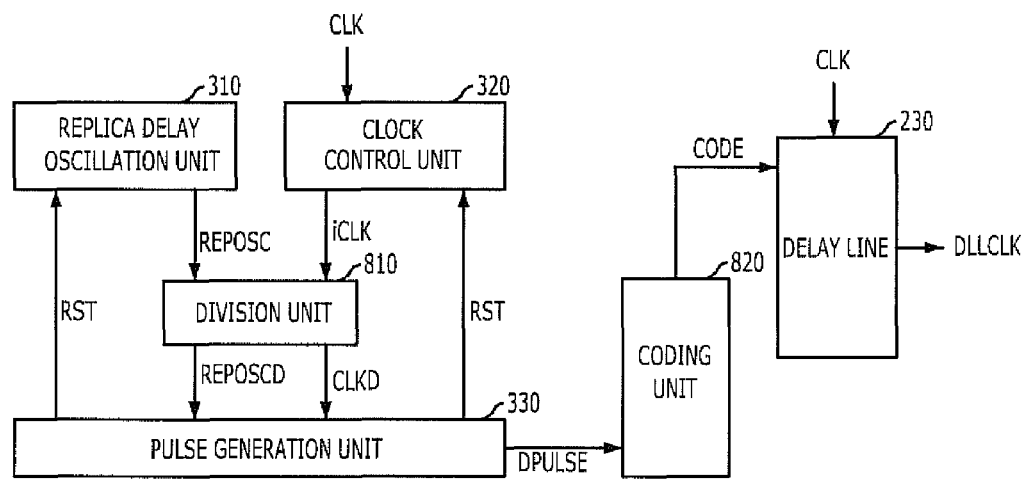
FIG. 8 is a block diagram of a DLL in accordance with another embodiment of the present invention.

FIG. 8 is a block diagram of a DLL in accordance with another embodiment of the present invention.

Referring to FIG. 8, the DLL in accordance with another embodiment of the present invention includes a replica delay oscillation unit 310, a clock control unit 320, a division unit 810, a pulse generation unit 330, a coding unit 820, and a delay line 230.

The replica delay oscillation unit 310, the clock control unit 320, the pulse generation unit 330, and the delay line 230 of the DLL shown in FIG. 8 have substantially similar configurations as those of the DLL shown in FIGS. 2 and 3.

Therefore, only the operations of the division unit 810 and the coding unit 820 are described below.

The division unit 810 divides the replica oscillation signal REPOSC and the clock signal iCLK at a certain division ratio, and outputs a divided replica oscillation signal REPOSCD and a divided clock signal CLKD to the pulse generation unit 330. Allowable division ratios of the division unit 810 are those designed to meet a DLL locking time (tDDLK). For example, in the case of a double data rate three (DDR3) memory device, the tDDLK is 512*tCK (where tCK is one cycle of the clock signal). That is, delay locking should be achieved within 512 cycles of the clock signal CLK. Therefore, in this case the allowable division ratio of the division unit 810 is designed to achieve delay locking within 512 cycles of the clock signal CLK.

When the replica oscillation signal REPOSC and the input clock iCLK are divided and then used, the pulse width of the delay pulse DPULSE increases according to the division ratio. Thus, the oscillation signal OSC with an increased period is generated and used in the counting operation of the coding unit 820. For example, assuming that the division unit 810 divides the replica oscillation signal REPOSC and the clock signal iCLK at a division ratio of 32 and outputs the divided signals to the pulse generation unit 330, the oscillation signal OSC having one cycle equivalent to 32 times the unit delay amount of the delay line 230 is generated. Therefore, the coding unit 820 counts the number of cycles of the oscillation signal OSC which are included within the pulse width of the delay pulse DPULSE, codes the counted oscillation number, and outputs the code value CODE to the delay line 230.

Since the clock signal used inside the semiconductor device has a high frequency, a DLL is very sensitive to noise, and therefore, it is difficult to ensure a satisfactory operation margin for the DLL. Accordingly, a high frequency clock signal may cause malfunction in the DLL. However, by using the divided clock signal CLKD, a satisfactory operation margin may be obtained and the DLL may operate without being affected by noise.

In accordance with the exemplary embodiments of the present invention, the DLL locking time may be reduced by the use of the DLL having the open loop structure, thereby achieving fast operation and reducing current consumption. Moreover, since delay locking is achieved using a divided clock signal, the DLL is insensitive to noise.

While the present invention has been described with respect to the specific embodiments, it will be apparent to those skilled in the art that various changes and modifications may be made without departing from the spirit and scope of the invention as defined in the following claims.

What is claimed is:

1. A delay locked loop, comprising:
   a delay pulse generation unit configured to generate a delay pulse having a pulse width equal to a delay amount of a delay line for delay locking a clock signal;
   a coding unit configured to output a code value according to the delay pulse; and
   the delay line configured to delay the clock signal according to the code value.

2. The delay locked loop of claim 1, wherein the delay pulse generation unit comprises:
   a replica delay oscillation section configured to generate a replica oscillation signal having a period corresponding to a replica delay;
   a clock control section configured to output an internal clock signal in response to the clock signal; and
   a pulse generation section configured to generate the delay pulse according to the replica oscillation signal and the internal clock signal.

3. The delay locked loop of claim 2, wherein the replica delay oscillation section and the clock control section output the replica oscillation signal and the internal clock signal in synchronization with each other in response to a reset signal.

4. The delay locked loop of claim 1, wherein the coding unit comprises:
   an oscillator configured to generate an oscillation signal having a period corresponding to an integer multiple of a unit delay size of the delay line; and
   a counter configured to count a number of cycles of the oscillation signal within a pulse width of the delay pulse, and code the counted number of cycles.

5. The delay locked loop of claim 2, wherein the pulse generation section comprises:

a first detection signal generator configured to detect an edge of the replica oscillation signal, and output a first detection signal;
a second detection signal generator configured to detect an edge of the internal clock signal, and output a second detection signal;
a latch configured to generate the delay pulse in response to the first detection signal and the second detection signal; and
a reset signal generator configured to delay the second detection signal for a certain time and output a reset signal.

6. The delay locked loop of claim 5, wherein the first detection signal generator comprises:
a first inverter configured to invert the delay pulse;
a second inverter configured to invert the replica oscillation signal;
a third inverter configured to invert an output signal of the second inverter; and
a logic gate configured to perform an AND operation on the output signals of the first to third inverters, and output the first detection signal.

7. The delay locked loop of claim 5, wherein the second detection signal generator comprises:
an inverter configured to invert the internal clock signal; and
a logic gate configured to perform an AND operation on the delay pulse, the internal clock signal, and an output signal of the inverter, and output the second detection signal.

8. The delay locked loop of claim 5, wherein a delay time of the reset signal generator allows the delay line to delay the clock signal after the second detection signal is generated.

9. The delay locked loop of claim 5, wherein the latch is configured to generate the delay pulse which is activated in response to the first detection signal and deactivated in response to the second detection signal.

10. A delay locked loop, comprising:
a replica delay oscillation unit configured to generate a replica oscillation signal having a period corresponding to a replica delay;
a division unit configured to divide the replica oscillation signal and a clock signal;
a pulse generation unit configured to generate a delay pulse having a pulse width equal to a delay amount through a delay line for delay locking the clock signal according to output signals of the division unit;
a coding unit configured to output a code value according to the delay pulse; and
the delay line configured to delay the clock signal according to the code value.

11. The delay locked loop of claim 10, further comprising a clock control unit configured to transmit the clock signal to the division unit, wherein the replica delay oscillation unit and the clock control unit output the replica oscillation signal and the clock signal in synchronization with each other in response to a reset signal.

12. The delay locked loop of claim 10, wherein the coding unit comprises:
an oscillator configured to generate an oscillation signal having a period corresponding to an integer multiple of a unit delay size of the delay line; and
a counter configured to count a number of cycles of the oscillation signal within a pulse width of the delay pulse, and code the counted number of cycles.

13. The delay locked loop of claim 12, wherein the oscillator is configured to generate the oscillation signal having a period corresponding to a division ratio of the division unit.

14. A delay locked loop, comprising:
a delay pulse generation unit configured to generate a delay pulse having a pulse width equal to a delay amount of a delay line for delay locking a clock signal;
a coding unit configured to code the delay pulse and output a code value; and
the delay line configured to delay an input clock by the code value, and generate a delayed locked clock,
wherein the delay pulse has a logic high level state during a third period equivalent to a difference between a first period, which corresponds to an integer multiple of the input clock, and a second period, which is a certain replica delay period.

15. The delay locked loop of claim 14, wherein the delay pulse generation unit comprises:
a replica delay oscillation section configured to output a replica oscillation signal having a period corresponding to the replica delay period; and
a pulse generation section configured to generate the delay pulse according to the replica oscillation signal and the input clock.

16. The delay locked loop of claim 15, wherein the pulse generation section is configured to output the delay pulse which is activated to a logic high level state at an end time of the second period, maintains a logic high level state during the third period, and is deactivated to a logic low level state at an end time of the first period.

17. The delay locked loop of claim 14, wherein the coding unit comprises:
an oscillator configured to generate an oscillation signal having a period corresponding to an integer multiple of a unit delay size of the delay line; and
a counter configured to count a number of cycles of the oscillation signal included within the third period, code the counted number of cycles, and output the code value.

18. A method for driving a delay locked loop, the method comprising:
generating a delay pulse having a pulse width equal to a delay amount of a delay line for delay locking a clock signal;
coding the delay pulse to output a code value; and
delaying an input clock by the code value to generate a delayed locked clock,
wherein the delay pulse has a logic high level state during a third period equivalent to a difference between a first period, which corresponds to an integer multiple of the input clock, and a second period, which is a certain replica delay period.

19. The method of claim 18, wherein the generating of the delay pulse comprises:
outputting a replica oscillation signal having a period corresponding to the replica delay period; and
generating the delay pulse according to the replica oscillation signal and the input clock.

20. The method of claim 19, wherein the delay pulse is activated to a logic high level state at an end time of the second period, maintains a logic high level state during the third period, and is deactivated to a logic low level state at an end time of the first period.

21. The method of claim 18, wherein the coding of the delay pulse to output a code value comprises:
generating an oscillation signal having a period corresponding to an integer multiple of a unit delay size of a delay line;

counting a number of cycles of the oscillation signal included within the third period; and coding the counted number of cycles to output the count value.

* * * * *